(12) United States Patent
Kim

(10) Patent No.: US 7,420,129 B2
(45) Date of Patent: Sep. 2, 2008

(54) SEMICONDUCTOR PACKAGE INCLUDING A SEMICONDUCTOR DEVICE, AND METHOD OF MANUFACTURING THE SAME

(75) Inventor: Hyeong-Seob Kim, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 237 days.

(21) Appl. No.: 11/048,870

(22) Filed: Feb. 3, 2005

(65) Prior Publication Data

US 2005/0285230 A1 Dec. 29, 2005

(30) Foreign Application Priority Data

Jun. 28, 2004 (KR) .................. 10-2004-0049002

(51) Int. Cl.
*H01R 12/04* (2006.01)
(52) U.S. Cl. .............. 174/262; 174/258; 174/263; 257/686; 257/777; 257/E21.502; 257/E21.503
(58) Field of Classification Search ............ 174/262; 257/686, 777
See application file for complete search history.

(56) References Cited

U.S. PATENT DOCUMENTS 5,468,694 A * 11/1995 Taguchi et al. .............. 501/77

| | | | |
|---|---|---|---|
| 5,909,633 A | 6/1999 | Haji et al. | |
| 6,756,663 B2 * | 6/2004 | Shiraishi et al. | 257/686 |
| 6,862,189 B2 * | 3/2005 | Higuchi | 361/767 |
| 7,193,311 B2 * | 3/2007 | Ogawa et al. | 257/687 |

FOREIGN PATENT DOCUMENTS

| JP | 8-264581 A | 10/1996 |
|---|---|---|
| KR | 10-19960000220 B1 | 1/1996 |
| KR | 2002-0072595 A | 9/2002 |

OTHER PUBLICATIONS

Korean Office Action dated Mar. 22, 2006 w/English translation.

* cited by examiner

*Primary Examiner*—Dao H Nguyen
(74) *Attorney, Agent, or Firm*—Harness, Dickey & Pierce

(57) ABSTRACT

A method and apparatus of manufacturing a semiconductor device and the semiconductor device used in a semiconductor package are disclosed. The semiconductor device may include a main body having one or more supporting layers, a plurality of metal wires that may be formed as a plurality of inner connection pads and a plurality of outer connection pads, an outermost resin layer pattern formed on the surface of the main body, and including a plurality of openings exposing the plurality of outer connection pads, and a metal oxide layer disposed between the plurality of metal wires and the outermost resin layer pattern. The plurality of inner and outer connection pads may be formed on a surface of the main body.

21 Claims, 5 Drawing Sheets

SEMICONDUCTOR PACKAGE INCLUDING A SEMICONDUCTOR DEVICE, AND METHOD OF MANUFACTURING THE SAME

This U.S. non-provisional application claims priority to Korean Patent Application No. 2004-49002, filed on Jun. 28, 2004, in the Korean Intellectual Property Office, the contents of which are incorporated by reference herein in their entirety.

BACKGROUND OF THE INVENTION

1. Field of the Invention

Example embodiments of the present invention relate generally to a semiconductor package and a method of manufacturing the same, and more particularly, to a printed circuit board (PCB) used in the semiconductor package, a semiconductor package using the PCB, and a method of manufacturing the same.

2. Description of the Related Art

In general, a semiconductor package may include a substrate, a semiconductor chip attached on a surface of the substrate, and a conductive member, such as a solder ball attached on an opposite surface of the substrate. In a conventional semiconductor package, the semiconductor chip and the solder ball may be attached on one surface of the substrate.

A printed circuit board (PCB) may be used as the substrate for the semiconductor package. The PCB may include a main body, on which one or more supporting layers may be stacked, a metal wire formed on each of the supporting layers to penetrate the layers, and an outermost resin layer pattern. The supporting layer may be an insulating layer formed of, for example a glass-fiber resin. In addition, the metal wire may be formed of a conductive material, such as copper (Cu), and may electrically connect the semiconductor chip and the solder ball in the semiconductor package. The outermost resin layer pattern may be formed of a material, such as a photo solder resist (PSR) to seal the metal wire formed on the surface of the main body so as not to expose the wire in an atmosphere. However, some of the metal wires formed on the surface of the main body may be exposed by a plurality of openings formed in the outermost resin layer pattern. The exposed metal wires may function as an outer connection terminal that may be electrically connected to the semiconductor chip and/or the solder ball. In addition, a plating layer, made from, for example, nickel/gold (Ni/Au) may be further formed on the exposed surface of the outer connection terminal.

However, the outermost resin layer pattern of the PCB may not have a good adhesion to the metal wire, especially with copper wire. If the adhesion between the outermost resin layer and the copper wire is not good, the outermost resin pattern may be detached and a gap can be generated on an interface therebetween. Moreover, cracks may be generated on the outermost resin layer pattern and/or copper wire when the semiconductor chip is attached onto the PCB by pressure. These problems may degrade the life span of the semiconductor package and reliability thereof.

Further, in the conventional art, a portion of the surface of the copper wire may be etched by using chemicals to increase the roughness of the surface of the copper wire (e.g., increase surface area of the copper wire) so as to improve the adhesive force. In other words, the contacting area between the outermost resin layer pattern and the copper wire may need to increase so as to produce an increase adhesive force therebetween. However, increasing the surface area between the copper wire and the outermost resin layer pattern has produced a limit in the amount of adhesive force.

SUMMARY OF THE INVENTION

Example embodiments of the present invention may provide a semiconductor device having at least a main body including one or more supporting layers, a plurality of metal wires that may be formed as a plurality of inner connection pads and a plurality of outer connection pads, are formed on a surface of the main body, an outermost resin layer pattern formed on the surface of the main body, and including a plurality of openings exposing the plurality of outer connection pads, and a metal oxide layer disposed between the plurality of metal wires and the outermost resin layer pattern.

In other example embodiments, the supporting layers may be formed from insulating materials.

In yet other example embodiments, the insulating materials may be made from a resin.

In yet other example embodiments, the resin may be a glass-fiber resin.

In other example embodiments, the insulating materials may be stacked.

In other example embodiments, the plurality of metal wires formed as the plurality of inner connection pads may penetrate into the supporting layers.

In other example embodiments, the metal oxide layer may be disposed on the plurality of metal wires formed as the inner connection pads.

In yet other example embodiments, the metal oxide layer may be disposed on the plurality of metal wires formed as the outer connection pads.

In other example embodiments, the metal oxide layer may be at least one of a CuO layer and a $Cu_2O$ layer.

In other example embodiments, the plurality of inner and outer connection pads may be formed on a top surface of the main body.

In other example embodiments, the plurality of inner and outer connection pads may be formed on a bottom surface of the main body.

In other example embodiments, the plurality of inner and outer connection pads may be formed on a top surface and a bottom surface of the main body.

In other example embodiments, the outermost resin layer pattern may be formed from a photo solder resist material.

In other example embodiments, the outermost resin layer pattern may be formed on a top surface of the main body.

In other example embodiments, the outermost resin layer pattern may be formed on a bottom surface of the main body.

In other example embodiments, the outermost resin layer pattern may be formed on a top surface and a bottom surface of the main body.

In other example embodiments, the opening on the outermost resin layer pattern may be formed by etching.

In other example embodiments, the metal wire may be formed of a copper material.

In other example embodiments, the semiconductor device may include a plating layer formed on the plurality of outer connection pads.

In yet other example embodiments, the plating layer may be at least one of Au layer, Ni/Au layer, Ni/Au/Sn layer, and Ni/Au/Sn/Pb layer.

In other example embodiments, the plurality of metal wires formed as the outer connection pads may be electrically connected to a conductive member.

In yet other example embodiments, the conductive member may be at least one of a solder ball, a bonding wire and a bumper.

In other example embodiments, the semiconductor device may be a printed circuit board.

Another example embodiment of the present invention may provide a method of manufacturing having at least forming a main body having one or more supporting layers, forming a plurality of metal wires that forms a plurality of inner and outer connection pads on a surface of the main body, forming a metal oxide layer on a surface of the plurality of metal wires, forming an outermost resin layer on the surface of the main body where the metal oxide layer may be formed, forming a plurality of openings that may expose the plurality of outer connection pads by patterning the outermost resin layer, and removing the metal oxide layer formed on a surface of the plurality outer connection pads.

In other example embodiments, the metal oxide layer may be formed by applying the surface of the plurality of metal wires with an oxidation agent.

In other example embodiments, the metal oxide layer may be formed by applying the surface of the plurality of metal wires with a chemical.

In yet other example embodiments, the chemical may be at least one of an acid and an alkali solution.

Another example embodiment of the present invention may provide a method of manufacturing having at least forming a main body having one or more supporting layers, forming a plurality of metal wires that forms a plurality of inner and outer connection pads on a surface of the main body, forming a plurality of inner connection wires by patterning the metal layer, forming a mask layer on the outer surface of the main body where the plurality of metal wires may be formed, forming a mask pattern that may expose the plurality of inner connection wires by patterning the mask layer, forming a metal oxide layer on a surface of the plurality of metal wires, removing the mask pattern, forming an outermost resin layer on the outer surface of the main body where the metal oxide layer may be formed, and forming an outermost resin layer pattern which may define openings to expose the plurality of outer connection pads by patterning the outermost resin layer.

In other example embodiments, the mask pattern may be removed by a liquid etching process.

Another example embodiment of the present invention may provide a semiconductor package having the semiconductor device, a semiconductor chip packaged onto the semiconductor device, and electrically connected to inner connection wires in the semiconductor device through some of a plurality of outer connection pads on the semiconductor device, and a conductive member attached on the semiconductor device, and electrically connected to the inner connection wires in the semiconductor device through the other outer connection pads on the semiconductor device.

Another example embodiment of the present invention may provide a method of manufacturing a semiconductor package. The method may include packaging a semiconductor chip onto the semiconductor device so that the semiconductor chip can be electrically connected to inner connection wires in the semiconductor device through some of a plurality of outer connection pads on the semiconductor device, and forming a conductive member so that the conductive member can be electrically connected to the inner connection wire in the semiconductor device through the other outer connection pads on the semiconductor device.

Another example embodiment of the present invention may provide a method of manufacturing a semiconductor package. The method may include packaging a semiconductor chip onto the semiconductor device so that the semiconductor chip can be electrically connected to inner connection wires in the semiconductor device through some of the plurality of outer connection pads on the semiconductor device, and forming a conductive member so that the conductive member can be electrically connected to the inner connection wire in the semiconductor device through the outer connection pads on the semiconductor device.

Example embodiments of the present invention may provide a semiconductor device and a method of manufacturing the same that may prevent and/or reduce a gap from generating on an interface between a metal wire and an outermost resin layer pattern, and a crack from generating on the metal wire and the outermost resin layer pattern by increasing an adhesive force between the metal wire and the outermost resin layer pattern.

Example embodiments of the present invention also may provide a semiconductor package and a method of manufacturing the same that may improve a life span and/or reliability of the semiconductor package by preventing and/or reducing a gap from generating on an interface between a metal wire and an outermost resin layer pattern, and a crack from generating on the metal wire and the outermost resin layer pattern by increasing an adhesive force between the metal wire and the outermost resin layer pattern.

BRIEF DESCRIPTION OF THE DRAWINGS

Example embodiments of the present invention will become more apparent by describing in detail with reference to the attached drawings in which.

DETAILED DESCRIPTION OF EXAMPLE EMBODIMENTS

Figure 1:
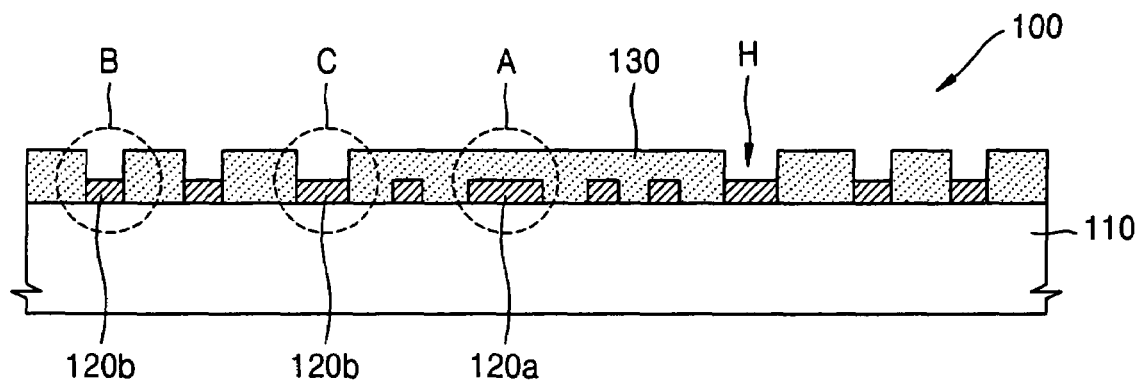
FIG. 1 is a schematic cross-sectional view illustrating a printed circuit board (PCB) according to an example embodiment of the present invention.

Example embodiments of the present invention will now be described more fully with reference to the accompanying drawings, in which example embodiments of the invention are shown. The invention may, however, be embodied in many different forms and should not be construed as being limited to the example embodiments set forth herein; rather, these example embodiments are provided so that this disclosure will be thorough and complete, and will fully convey the concept of the invention to those skilled in the art. Like reference numerals in the drawings denote like elements, and thus their description will be omitted. 100521 It should further be noted that the figures are intended to illustrate the general characteristics of methods and devices of example embodiments of this invention, for the purpose of the description of such example embodiments herein. These drawings are not, however, to scale and may not precisely reflect the characteristics of any given embodiment, and should not be interpreted as defining or limiting the range of values or properties of example embodiments within the scope of this invention. Rather, for simplicity and clarity of illustration, the dimensions of some of the elements are exaggerated relative to other elements.

For example, the relative thicknesses and positioning of layers or regions may be reduced or exaggerated for clarity. Further, a layer is considered as being formed "on" another layer or a substrate when formed either directly on the referenced layer or the substrate or formed on other layers or patterns overlaying the referenced layer. Further, it will be understood that when a layer is referred to as being "on" or "formed on" another layer or substrate, the layer may be directly on the other layer or substrate, or intervening layer(s) may also be present.

Figure 2A:
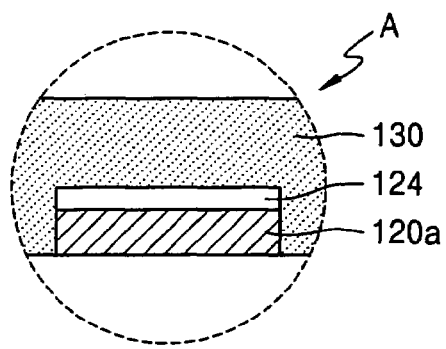
FIG. 2A is an enlarged view illustrating part A of FIG. 1.
Figure 2B:
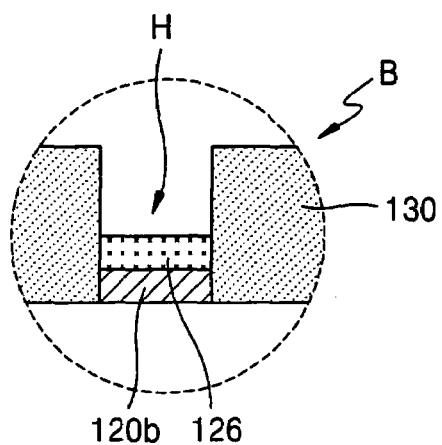
FIG. 2B is an enlarged view illustrating part B of FIG. 1.
Figure 2C:
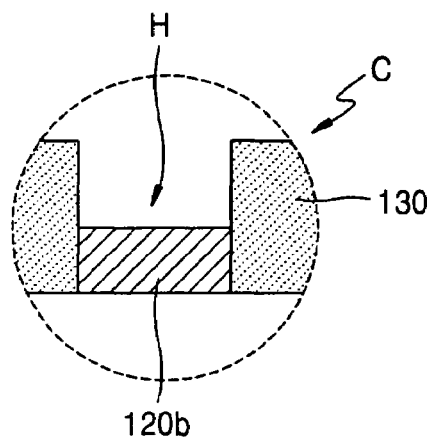
FIG. 2C is an enlarged view illustrating part C of FIG. 1.

FIG. 1 is a schematic cross-sectional view illustrating a printed circuit board (PCB) 100 according to an example embodiment of the present invention. FIGS. 2A through 2C are enlarged views showing parts A, B, and C of FIG. 1. Referring to FIGS. 1 and 2A through 2C, the PCB 100 may include a main body 110, a plurality of metal wires 120, an outermost resin layer pattern 130, and a metal oxide layer 124. A plating layer 126 may be further included in the PCB 100.

Referring to FIG. 1, the main body 110 may include one or more supporting layers formed of an insulating material. The insulating material may be formed of, for example, a resin, such as but not limited to, a glass-fiber resin. In addition, the supporting layer may be a single-layer structure or a multi-layer structure including two or more layers.

A plurality of metal wires 120 may be formed on a surface of the supporting layer and may be formed to penetrate into the supporting layer. In an example embodiment, when the main body 110 may include a plurality of supporting layers, metal wire patterns (not shown) may be formed on each surface of the supporting layers. It should be appreciated that the metal wire patterns that penetrate into the supporting layers can be formed to penetrate the entire supporting layers and/or some of the supporting layers. It should further be appreciated that there is no limit as to the shape of the metal wire patterns. The metal wires patterns may be modified variously by those skilled in the art according to usage of the PCB 100. It should be appreciated that copper (Cu) may be generally used as the metal wires 120. However, it should further be appreciated that other metals may be used as the metal wires.

The plurality of metal wires 120 may be formed as a plurality of outer connection pads 120b and a plurality of inner connection pads 120a. The outer connection pads 120b may be for electrically connecting semiconductor elements (not shown) to the PCB 100, and the inner connection pads may be for electrically connecting the outer connection pads 120b with each other. In an example embodiment, the outer connection pads 120b may be electrically connected to a semiconductor chip and/or to an outer connection terminal, such as a solder ball.

The outermost resin layer pattern 130 may protect the metal wires 120 formed on the surface of the main body 110. That is, the outermost resin layer pattern 130 may seal the metal wires 120 from the atmosphere so as to reduce and/or prevent the surface of the metal wires 120 from being oxidized due to vapor and/or oxygen in the atmosphere. A plurality of openings H may be formed in the outermost resin layer pattern 130, and the metal wires 120 formed as the outer connection pads 120b may be exposed through the openings H. The outermost resin layer pattern 130 may be formed of an insulating material, such as, but not limited to a photo solder resist (PSR). However, it should be appreciated that the outermost resin layer may be made formed from other materials.

Referring to FIG. 2A, the metal oxide layer 124 may be formed on the metal wires 120 formed as the inner connection pads 120a, and more particularly, on the metal wires 120 that may be formed on the outer surface of the main body 110 among the plurality of metal wires 120 on the inner connection pads 120a. In other words, the metal oxide layer 124 may be interposed between the outermost resin layer pattern 130 and the metal wires 120 formed as the inner connection pads 120a on the outer surface of the main body 110. In an example embodiment, the metal oxide layer 124 may directly contact the outermost resin layer pattern 130 so as to improve an adhesive force with the outermost resin layer pattern 130 because the oxygen of the metal oxide layer 124 and elements composing the outermost resin layer pattern 130 may be chemically bonded. In other words, because the metal oxide layer 124 and the outermost resin layer pattern 130 may be chemically bonded rather than merely being physically bonded, the adhesive force between the layers may be improved.

Referring to FIG. 2B, a plating layer 126 may be further formed on the metal layer 120 formed as the outer connection pad 120b. Alternatively, as shown in FIG. 2C, the plating layer 126 may not be formed on the metal layer 120 formed as the outer connection pad 120b. The plating layer 126, may be composed of, for example, gold (Au), nickel/gold (Ni/Au), nickel/gold/sulfur (Ni/Au/S), and/or nickel/gold/tin/lead (Ni/Au/Sn/Pb). However, it should be appreciated that other materials and/or combination of materials may be employed as the plating layer. The use of the plating layer 126 and the kind of plating layer 126 may be varied from the type of the semiconductor package used.

As described above, the PCB 100 shown in FIG. 1 may include the metal wires 120 formed as the outer connection pads 120b to all be formed on one surface. In other words, the metal wires 120 formed as the outer connection pad 120b, for electrically connecting the semiconductor chip and the conductive member, such as solder balls, may be formed on the upper surface of the main body 110. Further, the PCB 100 may be generally used to fabricate, for example a flip chip package. However, it should be appreciated that there is no limit in the arrangement of the outer connection pads 120b on the surface of the main body 110.

Figure 3:
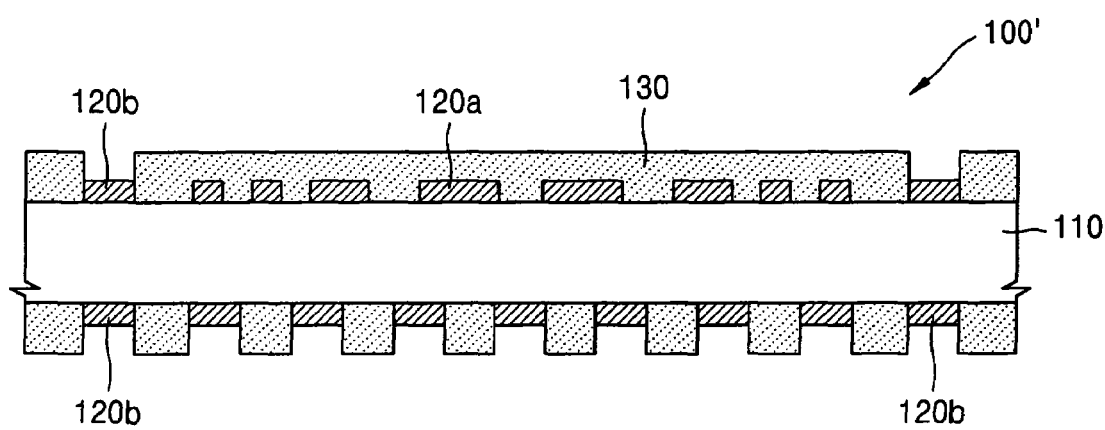
FIG. 3 is a schematic cross-sectional view illustrating a PCB according to another example embodiment of the present invention.

In an alternative example embodiment, as shown in FIG. 3, a PCB 100' may include outer connection pads 120b formed on upper and lower surfaces of the main body 110. In an example embodiment, the outer connection pad 120b formed on the upper surface of the main body 110 may be electrically connected to a conductive member, such as a bumper and/or a bonding wire of the semiconductor chip, and the outer connection pad 120b formed on the lower surface of the main body 110 may be electrically connected to a conductive member, such as a solder ball. A metal oxide layer (not shown) may be disposed between the inner connection pad 120a and the outermost resin layer 130 in the PCB 100'. Further, a plating layer (not shown) may or may not be formed on the outer connection pad 120b.

FIGS. 4A through 4D are cross-sectional views illustrating a method of manufacturing the PCB according to an example embodiment of the present invention.

Figure 4A:
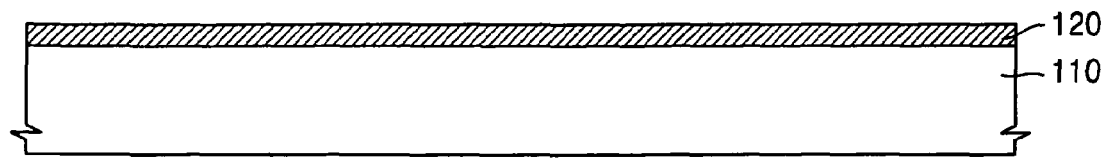
FIGS. 4A through 4D are cross-sectional views illustrating a method of manufacturing the PCB according to an example embodiment of the present invention.

Referring to FIG. 4A, the main body 110, on which a metal layer 120 may be formed, is prepared. As described with reference to FIG. 1, the main body 110 may include one or more supporting layers formed of insulating material, whereby inner connection wires may be formed on the surfaces of the supporting layers. Thus, according to the kind of PCB, the metal layer 120 may be formed on the upper surface of the main body 110, and/or on the lower surface of the main body 110.

Figure 4B:
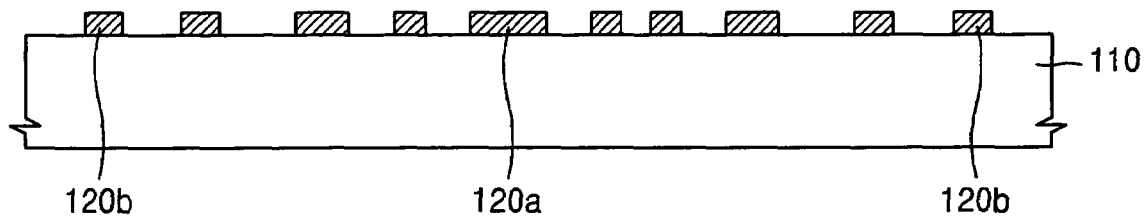

Referring to FIG. 4B, the metal layer 120 may be patterned using, for example, photolithography and etching processes. However, it should be appreciated that other processes may be employed to pattern the metal layer. A plurality of metal wires 120 may then be formed including the inner connection pads 120*a* and the outer connection pads 120*b* formed on the surface of the main body 110.

Figure 4C:
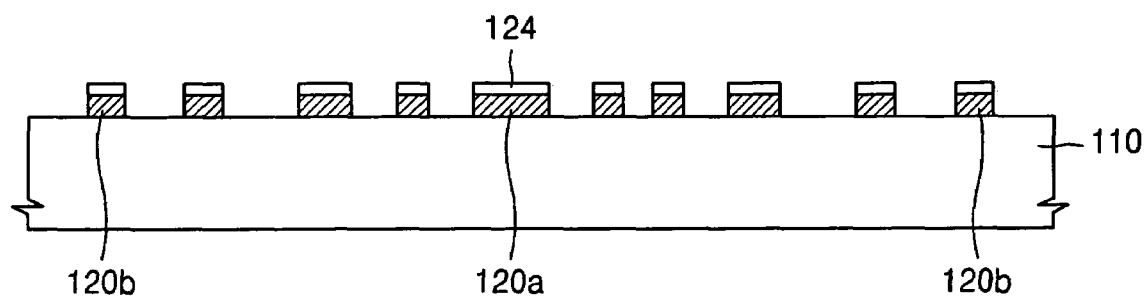

Referring to FIG. 4C, the metal oxide layer 124 may be formed on the surface of the metal wires 120 formed as the inner connection pads 120*a* and the outer connection pads 120*b*. As an example embodiment, the metal oxide layer 124 may be formed by employing, for example, a chemical such as, but not limited to, an acid or alkali solution, and/or an oxidizing agent. In an example embodiment, the metal wires 120 may be formed of, for example copper (Cu), and the metal oxide layer 124 may be formed as a CuO layer (black oxide) and/or a Cu2O layer (brown oxide).

Figure 4D:
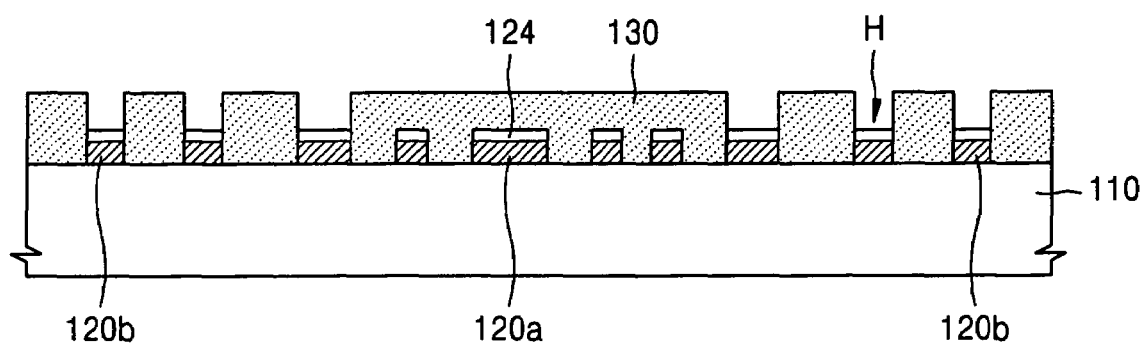

Referring to FIG. 4D, the outermost resin layer 130 may be applied on as a resultant, including where the metal oxide layer 124 may be formed. The outermost resin layer 130 may be formed of, for example, photo solder resist (PSR). In addition, the outermost resin layer 130 may be etched in a general patterning process to form openings H, for which the metal oxide layer 124 on the outer connection pad 120*b* may be exposed. Consequently, the outermost resin layer 130 may form a outermost resin layer pattern 134, on which the plurality of openings H may be formed.

It should be appreciated that the metal oxide layer 124 that may be exposed through the openings H may be removed. In addition, the plating layer (refer to reference numeral 126 in FIG. 2B) may be further formed on the outer connection pads 120*b*, when the metal oxide layer 124 is removed, if necessary. The removal of the metal oxide layer 124 and forming of the plating layer 126 may be performed using a general process in the art.

FIGS. 5A through 5D are cross-sectional views illustrating a method of manufacturing the PCB according to another example embodiment of the present invention.

Figure 5A:
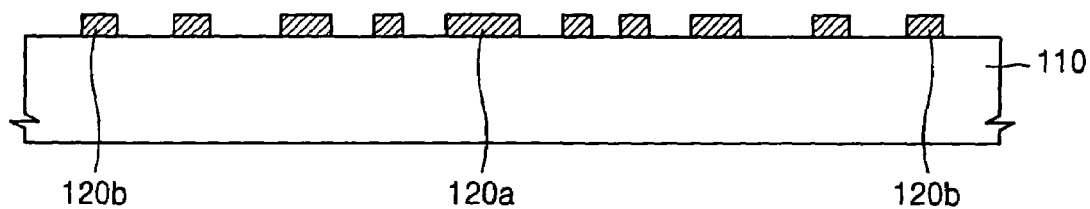
FIGS. 5A through 5D are schematic cross-sectional views illustrating a method of manufacturing the PCB according to another example embodiment of the present invention.

Referring to FIG. 5A, the main body 110 may include a plurality of metal wires 120 formed on the outer surface of the main body 110.

Figure 5B:
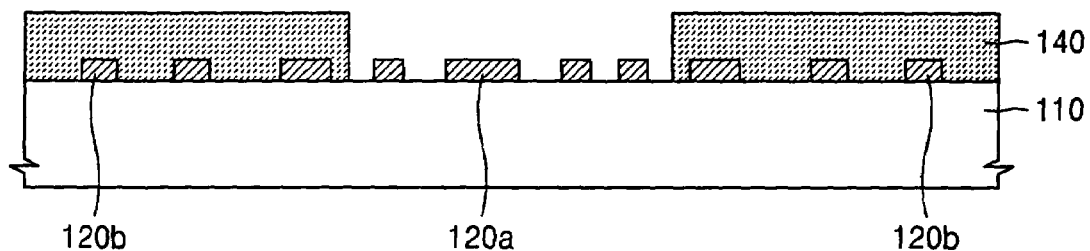

Referring to FIG. 5B, a mask pattern 140 may be formed on the main body 110, on which the plurality of metal wires 120 may be formed. In an example embodiment, the mask pattern 140 may be formed of the insulating material, and that the material may be resistive for the chemical solutions used in the process of forming a metal oxide layer 124. The mask pattern 140 may be formed of a material that may be mainly used in the semiconductor fabrication processes, for example, a photo solder resist (PSR) material, and/or a resin, such as an epoxy, a silicon oxide, and/or a silicon nitride. It should be appreciated that other materials may be employed for the mask pattern. The mask pattern 140 may be used to expose the metal wires 120 formed as the inner connection pads 120*a*, and form the metal oxide layer 124. Further, the mask pattern 140 may also be used so as to not expose the metal wires 120 formed as the outer connection pads 120*b*, and thus not form the metal oxide layer 124 on the outer connection pads 120*b*.

Figure 5C:
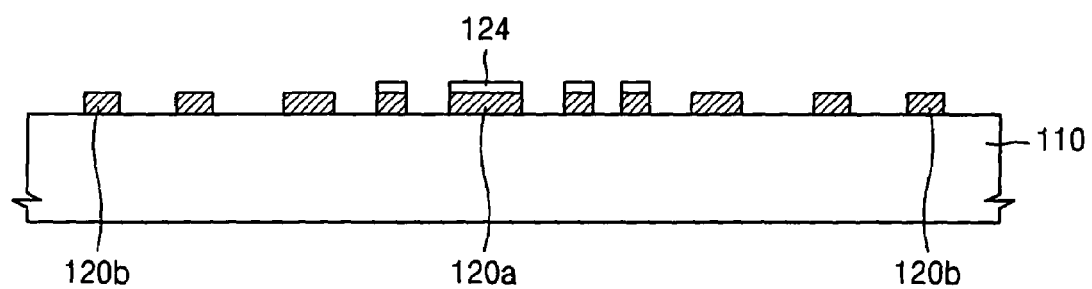

FIG. 5C illustrates the metal oxide layer 124 formed on the metal wires 120 formed as the inner connection pads 120*b*. In FIG. 5C, the metal oxide layer 124 may be formed on the metal wires 120 formed as the inner connection pads 120*a* by using the mask pattern 140 formed over the outer connection pads 120*b* as a mask. The mask pattern 140 may be removed using, for example, an liquid etching process.

Figure 5D:
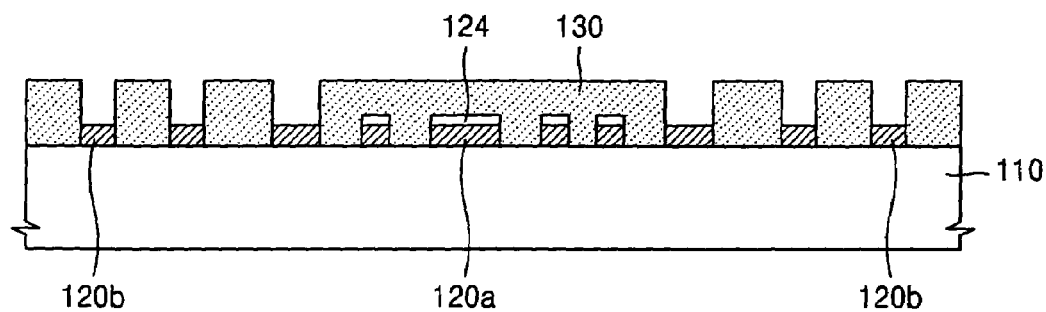

Referring to FIG. 5D, the outermost resin layer 130 may be formed and patterned on the outer surface of the main body 110, on which the plurality of metal wires 120 may be formed. The outermost resin layer 130 may form a outermost resin layer pattern 134 so as to expose the outer connection pads 120*b* through openings H. The openings H may be formed by, for example, using an etching process of the outermost resin layer 130. The outermost resin layer 130 may be formed of, for example, a photo solder resist (PSR) material.

According to the method of manufacturing the PCB 100 (100') according to an example embodiment of the present invention, the outermost resin layer pattern 134 may be easily fabricated.

Figure 6:
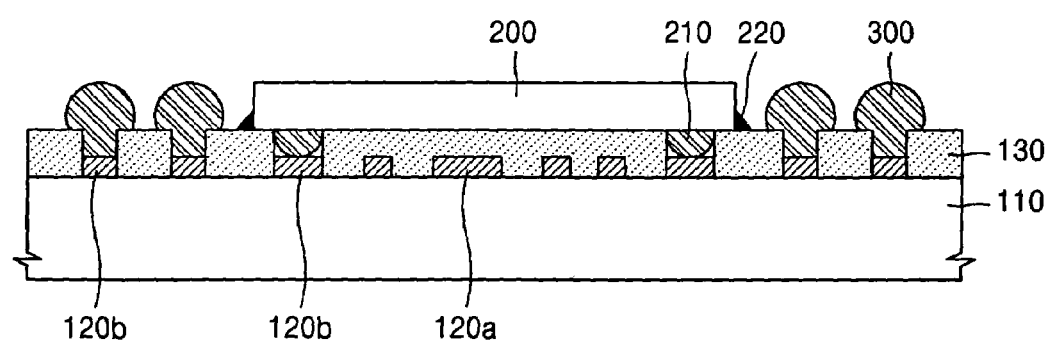
FIG. 6 is a schematic cross-sectional view illustrating a semiconductor package including the PCB shown in FIG. 1.
Figure 7:
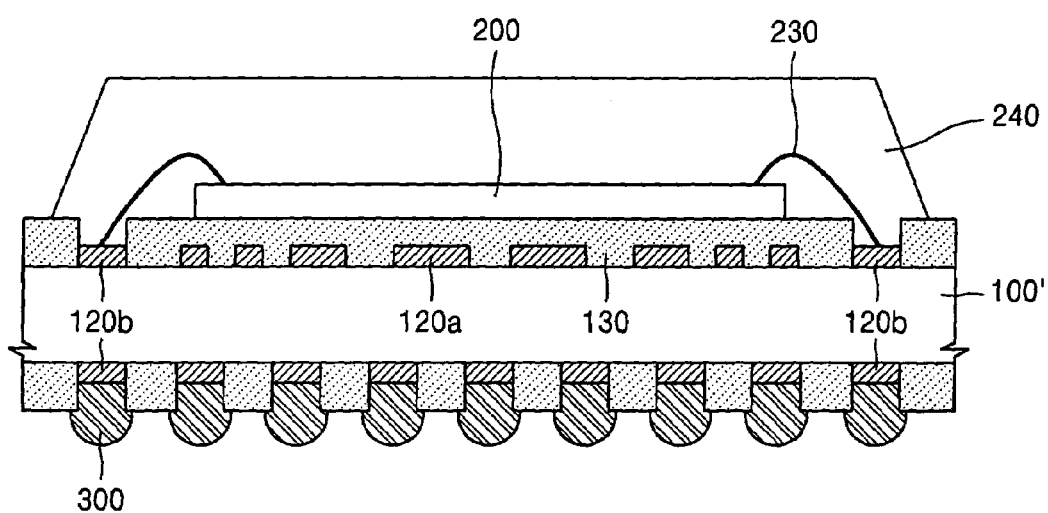
FIG. 7 is a schematic cross-sectional view illustrating a semiconductor package including the PCB shown in FIG. 3.

FIGS. 6 and 7 are schematic cross-sectional views illustrating a semiconductor package according to example embodiments of the present invention.

As shown in FIG. 6, the semiconductor package includes the PCB 100 according to an example embodiment shown in FIG. 1. As shown in FIG. 7, the semiconductor package includes the PCB 100' according to an example embodiment shown in FIG. 3. The semiconductor package may include the PCB 100 (100'), a semiconductor chip 200, and a conductive member, such as a solder ball 300.

Referring to FIG. 6, the PCB 100 may include a main body 110, a plurality of metal wires 120 formed as inner connection pads 120*a* and outer connection pads 120*b*, a metal oxide layer (not shown), and a outermost resin layer pattern 130 as similarly shown in FIG. 1. The semiconductor chip 200 may be attached on the outermost resin layer pattern 130 of the main body 110 using, for example, an adhesive. It should be appreciated that other attachments may be employed besides adhesive. In an example embodiment, a bump 210 of the semiconductor chip 200 may contact an outer connection pad 120*b*, and solder balls 300 may be formed on the other outer connection pads 120*b*. Further, a sealing material 220 may be employed where the semiconductor chip 200 and the PCB 100 may be contacted so as to securely attach the semiconductor chip 200 to the PCB 100.

Referring to FIG. 7, the PCB may include a main body 110, a plurality of metal wires 120 formed as inner connection pads 120*a* and outer connection pads 120*b*, a metal oxide layer (not shown), and a outermost resin layer pattern 130 as similarly shown in FIG. 3. The semiconductor chip 200 may be attached on the outermost resin layer pattern 130 of the main body 110 using, for example, an adhesive. It should be appreciated that other attachments may be employed besides adhesive. In an example embodiment, a bonding pad (not shown) of the semiconductor chip 200 may be electrically connected to an outer connection pad 120*b* through, for example, a bonding wire 230. In addition, the solder balls 300 may be formed on the other outer connection pads 120*b*. The semiconductor chip 200 and the bonding wire 230 may be molded by a sealing material 240, such as an epoxy resin. However, it should be appreciated that other sealing materials may be employed.

According to example embodiments of the present invention, the outermost resin layer of the PCB may be attached to the metal wire pattern by inducing a chemical bonding between the metal oxide layer and the outermost resin layer. Therefore, detachment of the outermost resin layer may not be generated, and may reduce and/or prevent a crack from generating on the outermost resin layer (e.g., detachment and/or a crack may produce moisture from infiltrating into the layers). Therefore, the yield and reliability of the semiconductor package including the PCB may be improved. Moreover, the PCB may be fabricated easily according to example embodiments of the present invention.

While the present invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. A semiconductor device, comprising:
a main body including one or more supporting layers;
a plurality of metal wires that may be formed as a plurality of inner connection pads and a plurality of outer connection pads on a surface of the main body;
an outermost resin layer pattern formed on the surface of the main body, the outermost resin layer pattern including a plurality of openings exposing the plurality of outer connection pads; and
a metal oxide layer disposed between the plurality of metal wires and the outermost resin layer pattern, the metal oxide layer being chemically bonded with the outermost resin layer pattern.

2. The semiconductor device of claim 1, wherein the supporting layers are formed from insulating materials, the insulating materials are stacked.

3. The semiconductor device of claim 2, wherein the insulating materials is made from a resin.

4. The semiconductor device of claim 1, wherein the plurality of metal wires formed as the plurality of inner connection pads penetrate into the supporting layers.

5. The semiconductor device of claim 1, wherein the metal oxide layer is disposed on the plurality of metal wires formed as the inner connection pads.

6. The semiconductor device of claim 5, wherein the metal oxide layer is disposed on the plurality of metal wires formed as the outer connection pads.

7. The semiconductor device of claim 1, wherein the metal oxide layer is at least one of a CuO layer and a $Cu_2O$ layer.

8. The semiconductor device of claim 1, wherein the plurality of inner and outer connection pads are formed on a top surface of the main body.

9. The semiconductor device of claim 1, wherein the plurality of inner and outer connection pads are formed on a bottom surface of the main body.

10. The semiconductor device of claim 1, wherein the plurality of inner and outer connection pads are formed on a top surface and a bottom surface of the main body.

11. The semiconductor device of claim 1, wherein the outermost resin layer pattern is formed from a photo solder resist material.

12. The semiconductor device of claim 1, wherein the outermost resin layer pattern is formed on a top surface of the main body.

13. The semiconductor device of claim 1, wherein the outermost resin layer pattern is formed on a bottom surface of the main body.

14. The semiconductor device of claim 1, wherein the outermost resin layer pattern is formed on a top surface and a bottom surface of the main body.

15. The semiconductor device of claim 1, wherein the opening on the outermost resin layer pattern is formed by etching.

16. The semiconductor device of claim 1, wherein the metal wire is formed of a copper material.

17. The semiconductor device of claim 1, further comprising a plating layer formed on the plurality of outer connection pads.

18. The semiconductor device of claim 17, wherein the plating layer is at least one of Au layer, Ni/Au layer, Ni/Au/Sn layer, and Ni/Au/Sn/Pb layer.

19. The semiconductor device of claim 1, wherein the plurality of metal wires formed as the outer connection pads are electrically connected to a conductive member.

20. The semiconductor device of claim 19, wherein the conductive member is at least one of a solder ball, a bonding wire and a bumper.

21. The semiconductor device of claim 1, wherein the semiconductor device is a printed circuit board.

* * * * *